(12) United States Patent
Pobanz

(10) Patent No.: US 6,836,185 B1
(45) Date of Patent: Dec. 28, 2004

(54) HIGH-SPEED ELECTRO-OPTICAL MODULATOR DRIVERS AND METHOD

(75) Inventor: Carl Walter Pobanz, Westlake Village, CA (US)

(73) Assignee: Inphi Corp., Westlake Village, CA (US)

(*) Notice: Subject to any disclaimer, the term of this patent is extended or adjusted under 35 U.S.C. 154(b) by 8 days.

(21) Appl. No.: 10/151,059

(22) Filed: May 17, 2002

(51) Int. Cl.[7] .................................................. H03F 3/45
(52) U.S. Cl. ....................................... 330/260; 330/310
(58) Field of Search .................................. 330/259, 260, 330/290, 291, 310, 311, 85, 88, 99, 104

(56) References Cited

U.S. PATENT DOCUMENTS 5,045,807 A * 9/1991 Ishihara et al. .............. 330/260
5,635,874 A * 6/1997 Perrot ......................... 330/259

* cited by examiner

Primary Examiner—Henry Choe
(74) Attorney, Agent, or Firm—Koppel, Jacobs, Patrick & Heybl (57) ABSTRACT

A modulator driver design is disclosed that employs a differential pair amplifier coupled to feedback amplifiers through tuning networks. Each tuning network comprises a set of inductors that enables a broadband response while reducing the loading effect of the feedback amplifier. An active load is placed at the output to serve multiple purposes, including: generating a high output swing, enabling a lower power supply voltage, and allowing the entire bias circuit to be monolithically integrated. A modulator driver comprises: a first amplifier stage (A1) having inputs and outputs; a second amplifier stage (A2), having inputs and outputs, the inputs of the second amplifier coupled to the outputs of the first amplifier; an active load having inputs and outputs, the inputs of the active load coupled to the outputs of the amplifier stage; and a feedback stage (A3) having inputs and outputs, the inputs of the feedback stage coupled to the outputs of the second amplifier stage by means of a tuning network, and the outputs of the feedback stage coupled to the inputs of the second amplifier stage.

29 Claims, 8 Drawing Sheets

HIGH-SPEED ELECTRO-OPTICAL MODULATOR DRIVERS AND METHOD

CROSS REFERENCE TO RELATED APPLICATIONS

This application relates to a co-pending U.S. patent application Ser. No. 10/034,023, entitled "FET Active Load and Current Source" by Carl Walter Pobanz, filed on Dec. 28, 2001, owned by the assignee of this application and incorporated herein by reference.

BACKGROUND INFORMATION

1. Field of the Invention

The present invention relates generally to electro-optical devices, and more specifically to modulator drivers for high-speed communications.

2. Description of Related Art

In a high-speed fiber optics communication system, the light is often transmitted into the fiber by a continuous-wave laser followed by an electro-optical modulator. The modulator, which turns the light ON and OFF to generate logical ones and zeros for transmission, is generally fabricated with a non-linear material such as Lithium Niobate ($LiNbO_3$) or Indium Phosphide (InP). These materials exhibit a change in optical refractive index or absorption as a function of an applied voltage. Due to the weakness of such electro-optic effects, a substantial voltage is required to maximize the ratio of optical power between on and off states (the extinction ratio) of the modulated light. Moreover, since the modulator operates at or near the full bit-rate of the communications system, the electrical input to the modulator has both the largest magnitude and highest bandwidth of any signal in the system. Producing this signal requires an amplifier, known as a modulator driver, which achieves high output amplitude and high speed without degrading the quality of the transmitted pulse.

One popular type of electro-optic modulator is the Mach-Zehnder (MZ) modulator, which uses the linear electro-optic (Pockels) effect—commonly in $LiNbO_3$—and an interferometer to generate light pulses. A typical MZ modulator requires a 6-volt peak-to-peak drive applied to a single input ("single drive") or applied differentially to, two inputs 180 degrees out of phase ("dual drive"). In a practical application, the modulator driver should be capable of producing 7 to 8 volts peak-to-peak to obtain adequate margin for variations due to temperature, losses in the materials, drift, etc. Electro-absorption modulators typically require single-ended drive voltages on the order of 3 to 4 volts peak-to-peak.

The challenge in modulator driver design is to create an amplifier with high voltage swing, wide bandwidth, and high-fidelity pulse response. For example, in a 40-Gigabit per second (40 Gbps) system the transmitted data signal may contain substantial energy at frequencies up to and beyond 40 GHz, depending on the rise and fall times of the data pulse edges. The modulator driver requires an amplitude response that is nearly constant versus frequency, along with constant group delay (i.e., linear phase response)—in other words, all frequencies are amplified equally and travel at the same speed through the amplifier. Deviations from this ideal affect the transmitted data signal, producing pattern-dependent jitter in the timing of the transitions and decreased contrast between logic states ("eye closure").

Figure 1:
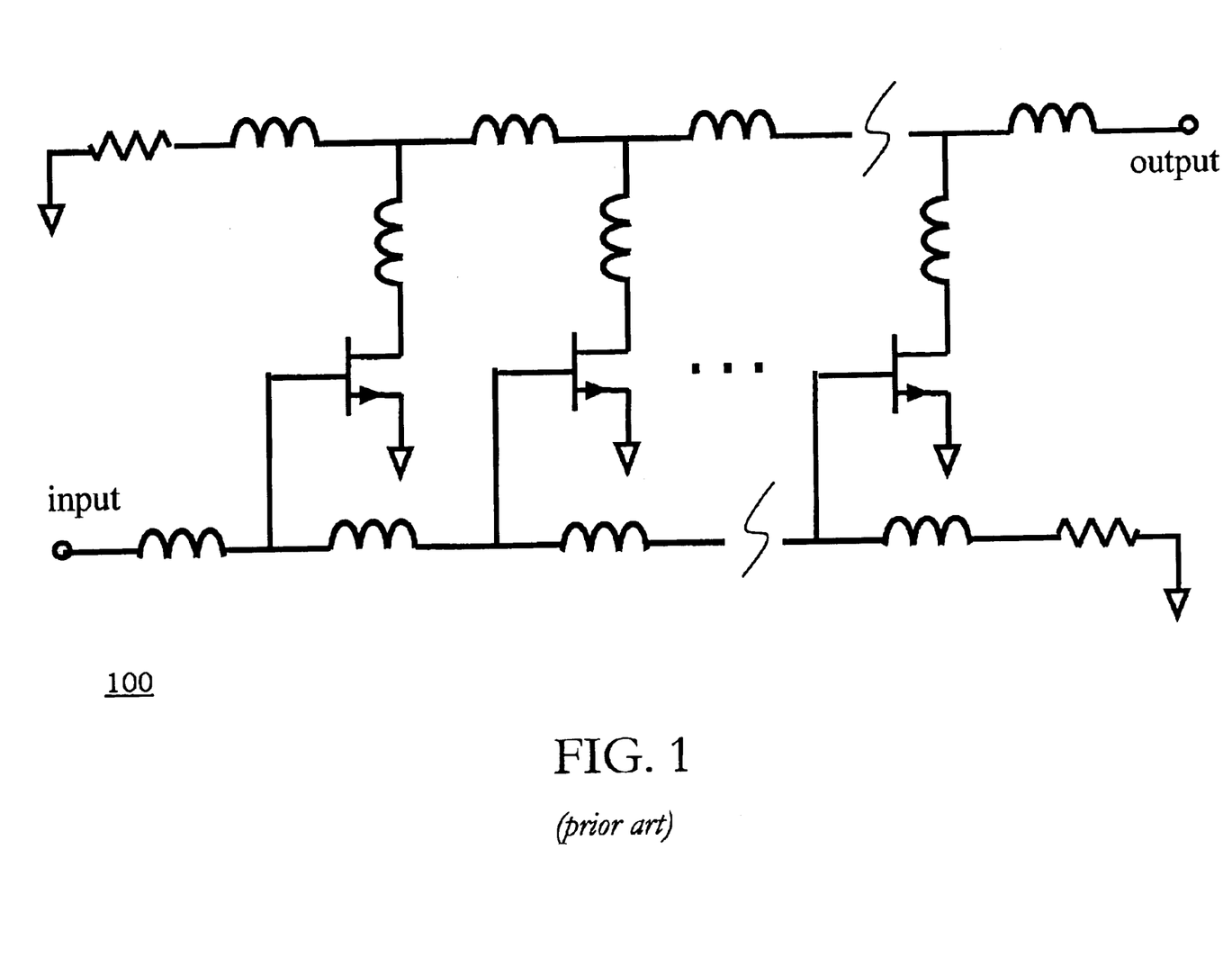
FIG. 1 is a prior art circuit diagram illustrating a distributed amplifier.

One objective in driver-amplifier design is to produce a large amount of current, which typically requires large transistors. The parasitics of the transistors—capacitance, resistance, and in some cases inductance, which increase with the size of the transistor—slow down the response, as time is wasted in transferring energy to them rather than to the actual load, the modulator. One classic solution that achieves high speed with a large effective transistor size is the distributed amplifier 100 as shown in FIG. 1, either with a single output or a differential output. This approach defines a certain transistor size that is necessary for the desired output amplitude, and then divides up a large transistor into multiple smaller transistors, which are connected by inductors in such a way that the parasitic capacitance of each small transistor in conjunction with the inductors forms a transmission line. The inductors (or high-impedance transmission line sections) allow the smaller capacitors to charge in sequence, emulating the propagation of a wave in a transmission line, thus obtaining larger bandwidth at the acceptable expense of increased delay. Thus this circuit is also known as a "traveling wave amplifier."

In recent modulator driver designs for next-generation optical networks that require transmission rates of 40G (OC-768), 50G, and beyond, the distributed amplifier approach has been widely used to achieve the required bandwidth and output amplitude. However, traveling-wave amplifiers occupy a significant amount of die space as the circuits themselves are physically large and make very inefficient use of substrate area. Furthermore, the individual frequency responses of the multiple small transistors produce numerous poles in the amplifier's transfer function that coincide near the upper bandwidth limit of the amplifier. Beyond this cutoff frequency, the gain decreases sharply and the phase becomes highly nonlinear, creating large variations in group delay as the band edge is approached. Discontinuities and mismatches between devices in the circuit cause unwanted reflections and reactive energy storage in the transmission lines, further degrading the amplitude and phase characteristics as frequency increases. Consequently, in order to mitigate these problems and increase the usable frequency range, designers end up creating a much larger and broader-band amplifier than is necessary, thereby producing an inefficient amplifier structure.

Another shortcoming in a conventional design is that it typically requires an external means of biasing, such as a bias tee, which separates DC and AC allowing the power supply and the output signal to coincide on the same line. A bias tee is generally impossible to integrate onto a chip due to the large inductor required to meet the low-frequency requirements of optical data signals (e.g. below 50 kHz). It must be added externally, increasing assembly cost and complicating the packaging of the chip as well as degrading the response of the amplifier. Furthermore, traveling-wave amplifiers produce relatively low gain, typically requiring a pre-driver in order to operate with standard inputs such as 400-millivolt peak-to-peak current-mode logic (CML) signals from multiplexer devices and the like. Increasing the gain is difficult without sacrificing bandwidth, and often means adding another traveling-wave amplifier in series, thus multiplying the shortcomings of the architecture twofold.

Accordingly, there is a need to design an amplifier with a large output voltage and current swing capability, having optimum amplitude and phase characteristics over a broad frequency range for driving modulators in a high-speed fiber optic system.

SUMMARY OF THE INVENTION

The present invention provides a modulator driver design that employs a differential amplifier coupled to feedback amplifiers through tuning networks. Each tuning network comprises a set of inductors that enables a broadband response, while reducing the loading effect of the feedback amplifier. An active load is placed at the output to serve multiple purposes: generating a high output voltage swing, reducing the required power supply voltage, and allowing the bias circuits to be integrated on a chip.

A modulator driver comprises: a first amplifier stage (A1) having inputs and outputs; a second amplifier stage (A2), having inputs and outputs, the inputs of the second amplifier coupled to the outputs of the first amplifier; an active load having inputs and outputs, the inputs of the active load coupled to the outputs of the amplifier stage; and a feedback stage (A3) having inputs and outputs, the inputs of the feedback stage coupled to the outputs of the second amplifier stage by means of a tuning network, and the outputs of the feedback stage coupled to the inputs of the second amplifier stage.

Advantageously, the present invention generates fully differential outputs, which enables operation with dual-drive optical modulators requiring only half the voltage swing, per input, of single-input modulators. The dual-drive capability also improves the performance of the optical system by allowing zero or non-zero adjustable chirp (phase shift) to be added to the optical signal for improved propagation in dispersive fiber.

Other structures and methods are disclosed in the detailed description below. This summary does not purport to define the invention. The invention is defined by the claims.

DETAILED DESCRIPTION OF PREFERRED EMBODIMENTS

Figure 2:
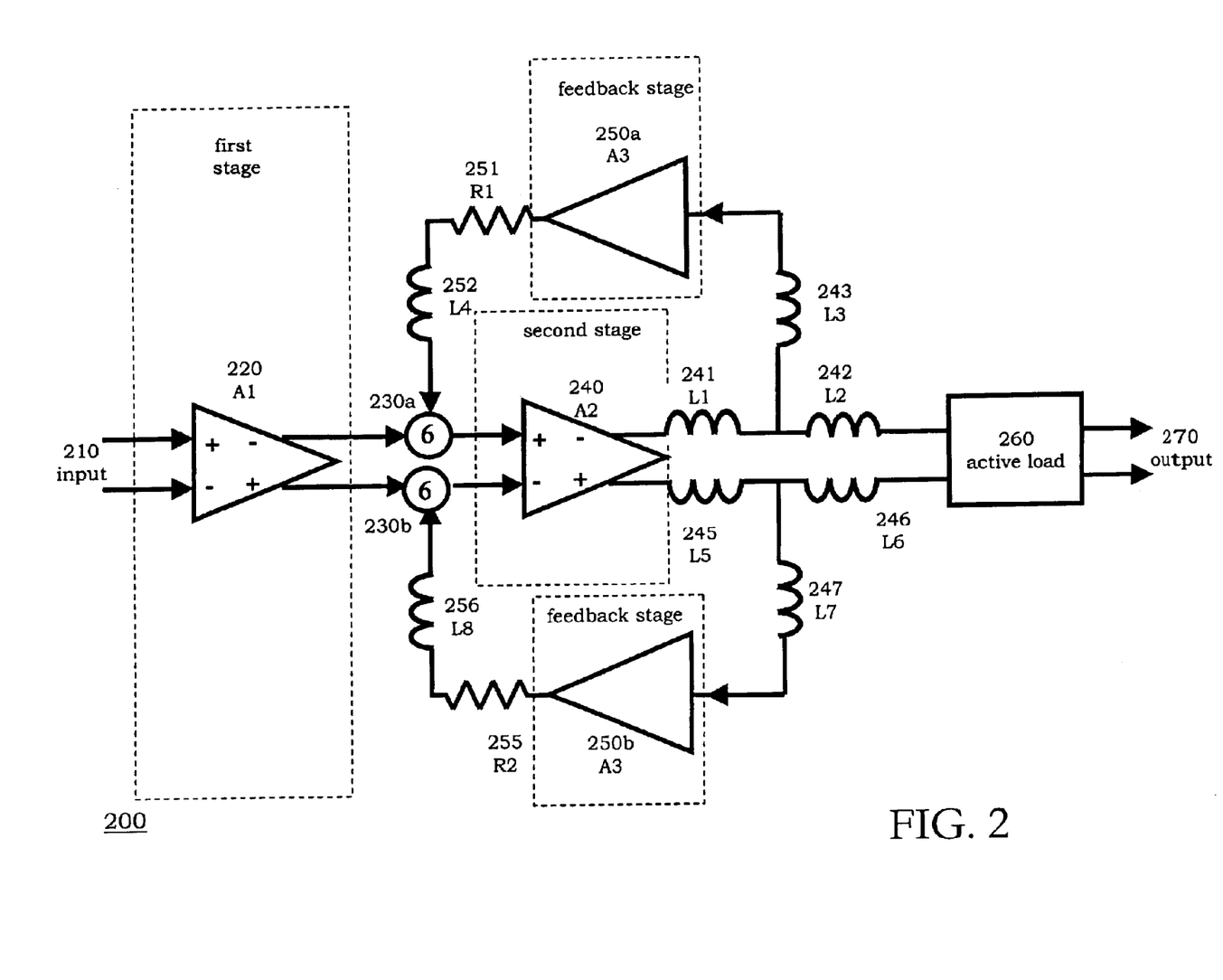
FIG. 2 is a block diagram illustrating a modulator driver for high-speed communications that employs a differential amplifier in accordance with the present invention.

FIG. 2 is a block diagram illustrating a modulator driver 200 for high-speed communications that employs a differential amplifier circuit. The modulator driver 200 comprises a first stage A1 220 amplifier, a second stage amplifier or output driver A2 240, a feedback stage amplifier A3 250a, a feedback stage amplifier A3 250b, and an active load 260. An input 210 is feed into the first stage A1 220 amplifier and an output 270 is generated to drive an external circuit or system, such as a modulator. The summing nodes 230a and 230b form a pair of differential feedback, where the summing node 230a is out of phase, but symmetric, with the summing node 230b. A first set of inductors, L1 241, L2 242, L3 243, and L4 252 are strategically placed for separating the output driver A2 240 and the feedback stage A3 250a. A second set of inductors, L5 245, L6 246, L7 247, and L8 256 are strategically placed for separating the output driver A2 240 and the feedback stage A3 250b. These inductors may be realized as lumped circuits such as spirals, or as transmission line sections having relatively high characteristic impedance.

Figure 3:
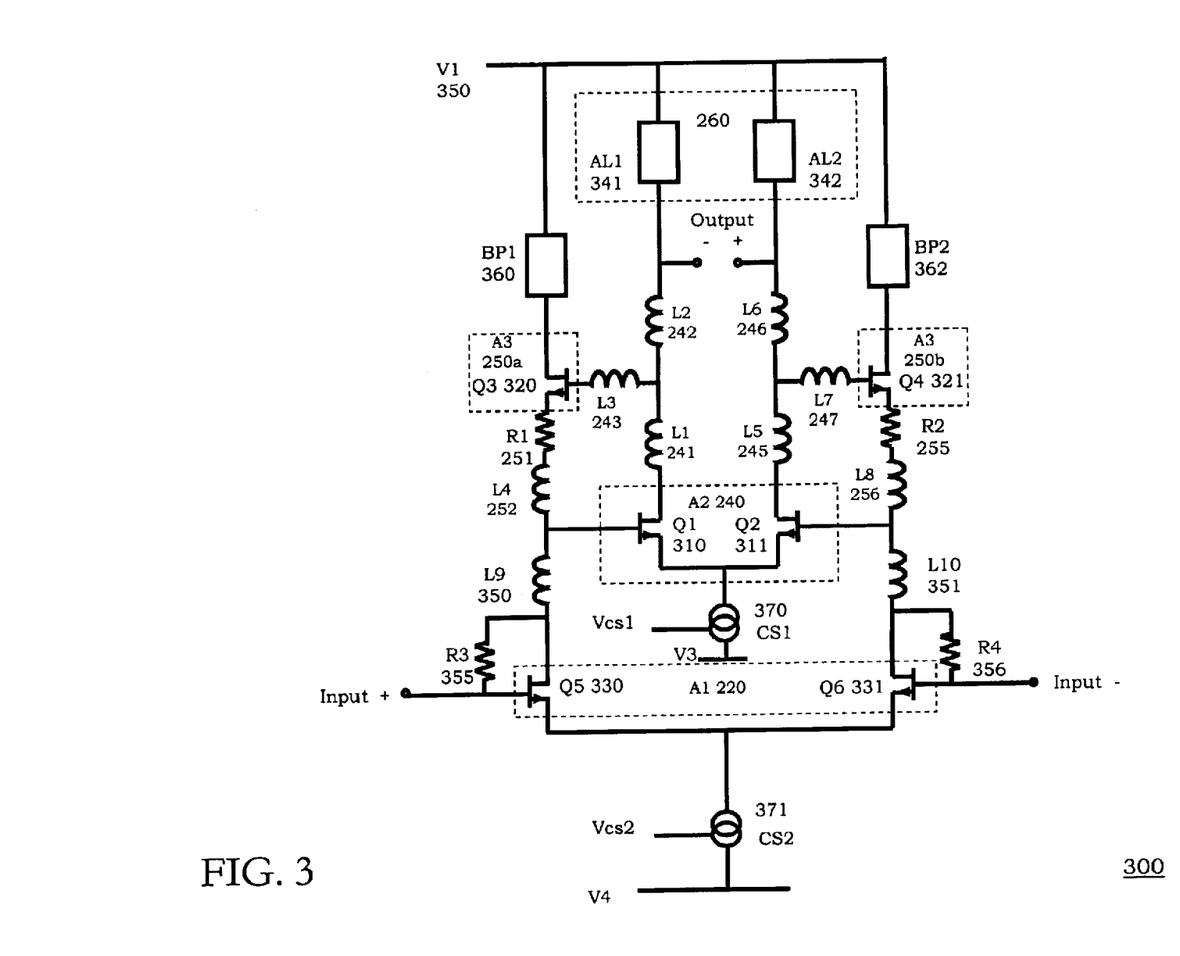
FIG. 3 is a circuit diagram illustrating a modulator driver for high-speed communication as shown in FIG. 2 in accordance with the present invention.

A circuit diagram 300 illustrating the block diagram of the modulator driver 200 is shown in FIG. 3. The modulator driver 200 employs a differential pair A2 240 with two large transistors Q1 310 and Q2 311, which connect respectively to active loads 341 and 342 that convert an electrical current that is switched by the transistors into an output voltage 270. To achieve wide bandwidth, strong feedback is provided around the differential pair 310 and 311 that forms the output stage. The feedback circuit is designed with followers Q3 320 and Q4 321, either source followers with FETs or emitter followers with bipolar transistors. On a first arm of the differential pair A2 240, the follower 320 drives a resistor R1 251 and the output current of the resistor R1 251 is routed back to the input of the differential pair Q1 310 in the modulator driver 300, which forms a negative feedback loop, thereby reducing the gain and increasing the bandwidth. On a second arm of the differential pair A2 240, the follower 321 drives a resistor R2 255 and the output current of the resistor R1 255 is routed back to the input of the differential pair Q2 311 in the modulator driver 300, which forms a negative feedback loop, thereby reducing the gain and increasing the bandwidth.

To achieve wide bandwidth, the amplifier at this point has low input impedance as a result of the feedback current. The parasitic capacitance at the input terminals of the output stage has less of an effect because the preceding amplifier is able to charge the parasitic capacitance relatively fast. The feedback results in a broadband amplifier, but the resulting gain is reduced. In order to increase the gain, the differential pair A1 220 operates as a first stage in the modulator driver 200; this first stage acting as a transconductance amplifier that receives a voltage input and generates a current output to directly drive the low-impedance input of the second differential pair A2 240.

The inductors L1 241, L2 242, L3 243, and L4 252 are strategically placed in the modulator 200, which separates the output driver A2 240 and the feedback device 250a. In a traditional design that strives for a large output swing, the follower device has to be large to effectively close the strong feedback loop. As a consequence, the follower device loads the output of the composite amplifier, resulting in slow response. In the present invention, the inductors L1 241, L2 242, and L3 243 form a T-coil type of network, and split the cumulative effect of the parasitic capacitances of the output driver A2 240, the active load AL1 260, and the follower in the feedback stage A3 250a, which increases significantly the bandwidth of the modulator driver 200. To compensate for the feedback and attain the desired transfer function of gain versus frequency, an inductor L4 252 is added, which connects in series with the output of the follower A3 250a. The inductor L4 252 affects the response of the feedback network to equalize the feedback gain in the presence of the network formed by the inductors L1 241, L2 242, and L3 243, which in turn increases the bandwidth and generates a desirable feedback response. By selecting the ratios between L1 241, L2 242, L3 243, L4 252, the resistance of the feedback resistor R1 251 and the size of the follower device Q3 230, a designer can manipulate the complex poles and zeros thereby produced in the amplifier's transfer function and achieve a number of different frequency response characteristics. Therefore, a desirable transfer function can be obtained by selecting the value of the inductors L1 241, L2 242, L3 243, and L4 252 to produce optimal pulse characteristics for a particular size of output driver A2 240.

The inductors L5 245, L6 246, L7 247, and L8 256 are strategically placed in the modulator 200, which separates the output driver A2 240 and the feedback device 250b. In a traditional design, in order to achieve a large output swing, the follower device has to be fairly large to effectively close the strong feedback loop, which slows down the output. In the present invention, the inductors L5 245, L6 246, L7 247 form a T-coil network, and split the cumulative effect of the parasitic capacitance of the output driver A2 240, the active load 260, and the follower in the feedback stage 250b, which increases significantly the bandwidth of the modulator driver 200. To compensate for the feedback and attain the desired transfer function of gain versus frequency, an inductor L8 256 is added, which connects in series with the output of the follower A3 250b. The inductor L8 256 affects the response of the feedback network to equalize the feedback gain in the presence of the network formed by the inductors L5 245, L6 246 and L7 247, which in turn increases the bandwidth and generates a desirable feedback response. By selecting the ratios between L5 245, L6 246, L7,247, L8 256, the resistance of the feedback resistor R2 255 and the size of the follower device Q4 231, a designer can manipulate the complex poles and zeros thereby produced in the amplifier's transfer function and achieve a number of different frequency response characteristics. Therefore, a desirable transfer function can be obtained by selecting the value of the inductors L5 245, L6 246, L7 247 and L8 256 to produce optimal pulse characteristics for a particular size of output driver A2 240.

To drive the output 270, the driver stage comprises a composite of amplifiers. In this embodiment, the amplifier A2 240 and the feedback amplifier A3 250a and 250b drive each other, with a feedback signal going to the summing node 230a between the two amplifiers 240 and 250a, and the summing node 230b between the two amplifiers 240 and 250b. In order to increase the gain-bandwidth of the composite amplifier, the output driver 200 adds the predriver 220, which is implemented with the third amplifier A1 220 that precedes the driver stage A2 240. The third amplifier A1 220 produces an amplified copy of the input signal 210 and delivers it with low output impedance. The low output impedance allows fast charging of parasitic capacitance associated with the driver A2 240 and further enhances the bandwidth.

The circuit diagram of the modulator driver 300 in FIG. 3 is implemented with field-effect transistors (FETs). The FETs can be fabricated, for example, in InP or GaAs as high electron mobility transistors (HEMT) or pseudomorphic high electron mobility transistors (PHEMT), or in silicon-based processes as complementary metal-oxide semiconductor (CMOS) FETs. A variety of bipolar transistors may also be used. The transistors Q1 310 and Q2 311 operate as a differential pair A2 240, which forms the second stage of the modulator driver 300. On the first arm of the differential pair A2 240, the inductors L1 241, L2 242, and L3 243 form a T-coil type of network, which increases the output bandwidth, and decouples the loading effect of the feedback device Q3 320. On the second arm of the differential pair A2 240, the inductors L5 245, L6 246, and L7 247, form a T-coil type of network, which increases the output bandwidth, and decouples the loading effect of the feedback device Q4 321. The Q3 320 transistor operates as a feedback follower device that closes the negative feedback loop from the output back to the input of Q1 310. The Q4 321 transistor operates as a feedback follower device that closes the negative feedback loop from the output back to the input of Q2 311. The inductors L4 252 and L8 256 equalize the closed-loop gain of the second stage A2 240 verses frequency. The first stage A1 220 drives the low impedance and high output swing of the second stage A2 240. The first stage A1 220 comprises the transistor Q5 330 and the transistor Q6 331, which are transconductance amplifiers that receive voltage inputs and generate current outputs. Inductors L9 350 and L10 351 create a series peaking function between the two stages to speed up the transient response. The addition of resistors R3 355 and R4 356 provides a feedback function, which not only speeds up the input to the first stage A1 220, but also improves the settling time of the output driver by providing a bleed current to Q3 320 and Q4 321 feedback devices during operation so that the Q3 320 and Q4 321 transistors are not completely shut off, and always remain in a fast operating regime. As a result, the modulator driver design 300 produces high output swing and broadband response. Current sources CS1 370 and CS2 371 supply a constant current to the amplifier stages A1 220 and A2 240 respectively, and present high impedance at the source nodes to decrease the common mode gain and enable differential operation. A pair of bypass networks BP1 360 and BP2 361 ensure low power supply impedance for followers 250 in the modulator driver 300.

Figure 4A:
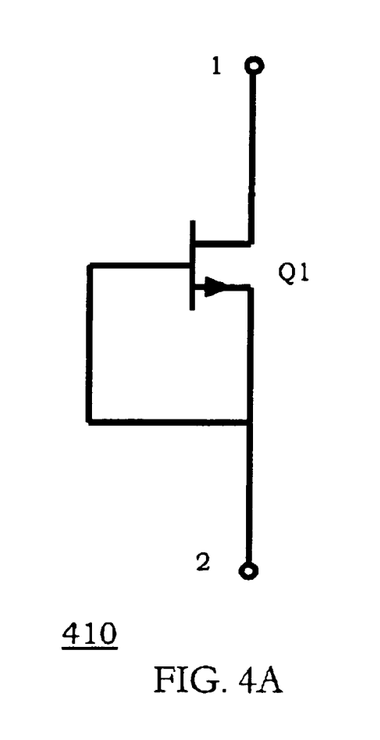
FIGS. 4A–4C are circuit diagrams illustrating examples of active loads in accordance with the present invention.
Figure 4B:
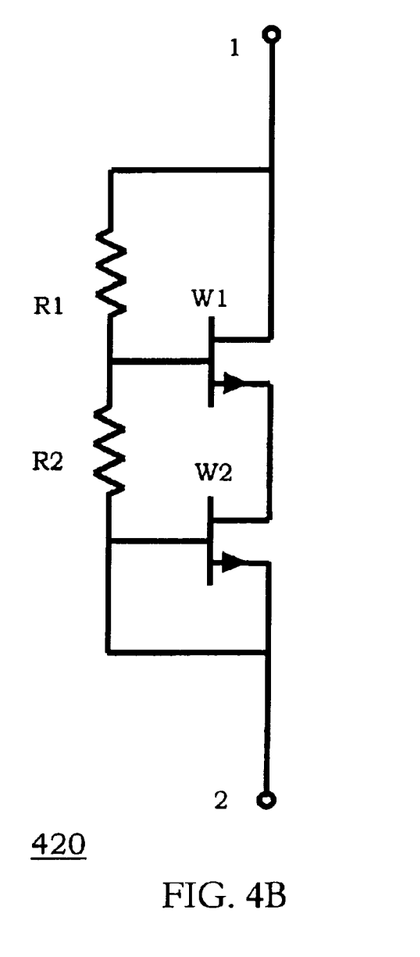
Figure 4C:
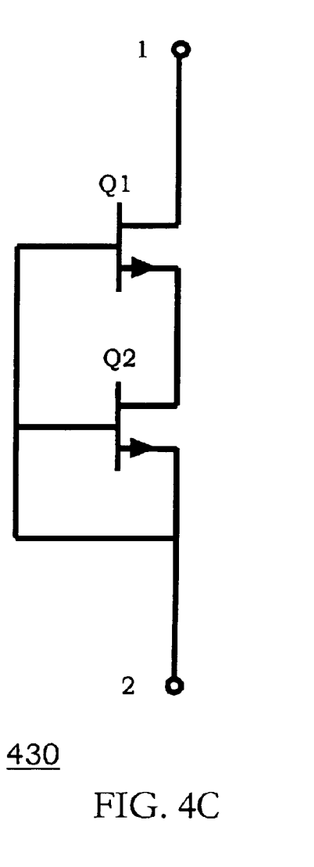

FIGS. 4A–4C are circuit diagrams 410, 420 and 430, illustrating examples of active loads, such as a "self-bootstrapped" load implemented with depletion-mode FETs. An active load is designed and selected so that the circuit has a significantly higher AC or dynamic resistance than its equivalent DC resistance. A more detailed description of the active loads has been disclosed in a co-pending patent application entitled "FET Active Load and Current Source," assigned to the same assignee, and accorded an application number of Ser. No. 10/034,023, which is incorporated herein by reference in its entirety.

Figure 5:
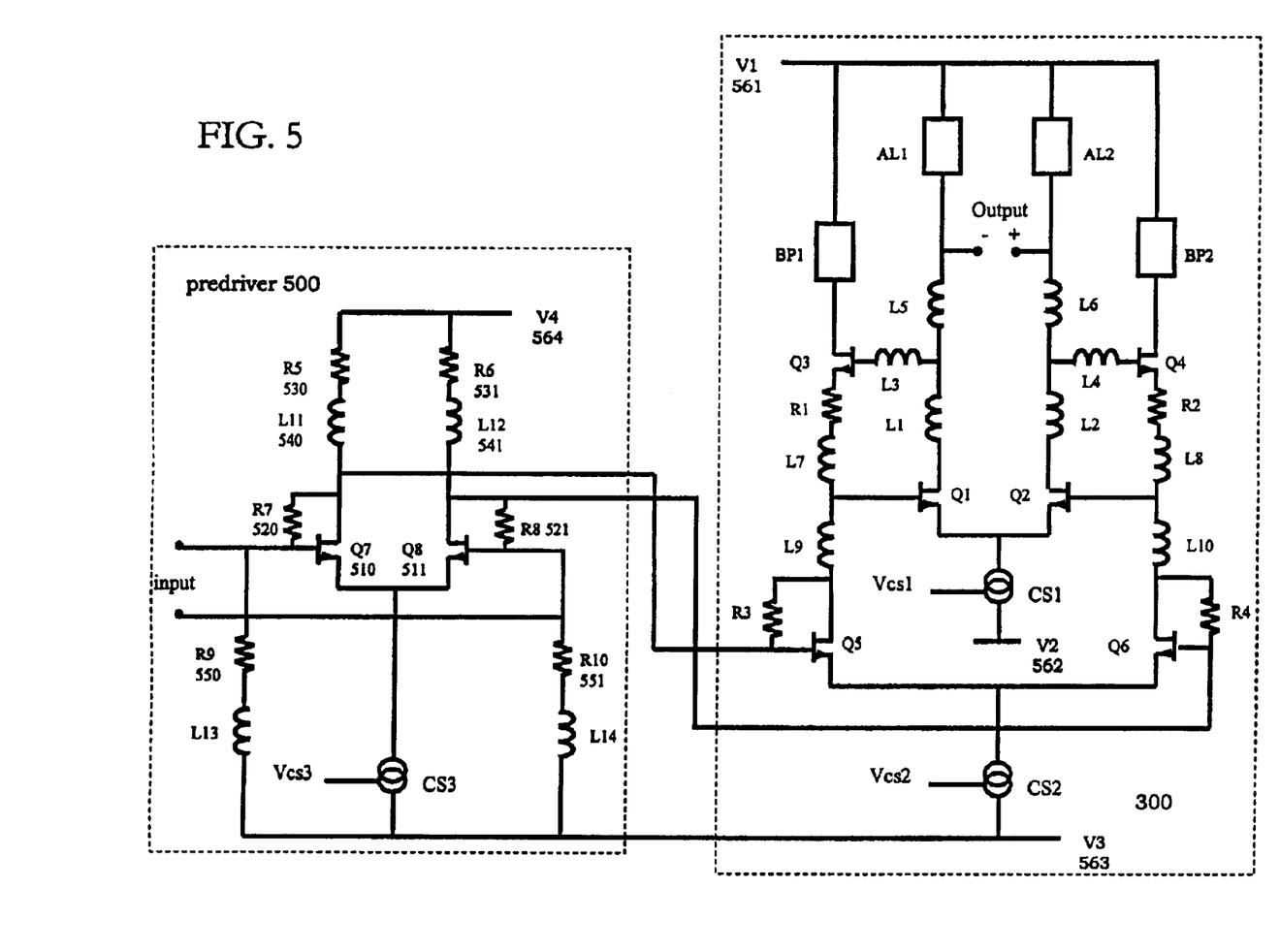
FIG. 5 is a circuit diagram illustrating a first embodiment of a predriver and the modulator driver in accordance with the present invention.

FIG. 5 is a circuit diagram illustrating a first embodiment of a broadband predriver circuit 510 and the modulator driver 300. The function of the predriver 510 is to produce a desired broadband resistive input impedance, such as 50 ohms or 100 ohms differential, and thereby facilitate a standard interface between the modulator driver and other circuits. Concurrently, the output of the predriver 500 exhibits a low impedance, which drives the modulator driver stage 300 in order to obtain the optimal bandwidth. To achieve broadband low output impedance, the predriver amplifier 510 employs a differential pair, a Q7 transistor 510 and a Q8 transistor 511, with a resistive feedback through R7 520 and a resistive feedback R8 521 that increase the bandwidth of the amplifier. Resistors R5 530 and R6 531 are chosen to achieve the desired low output impedance. Inductors L11 540 and L12 541 enhance the bandwidth by shunt peaking. The predriver 510 can be driven differentially at the input or with a single input, and provides a differential drive for the modulator driver. Therefore, the predriver 510 achieves low output impedance that produces the maximum bandwidth, and creates an unbalanced to balanced signal conversion, which allows the pre-driver 510 to operate with either a differential input or a single input. Resistors R9 550 and R10 551 provide the proper input DC bias level and also enhance the input impedance.

Supply voltages V1 561 and V4 564 are positive, relative to supply voltage V3 563. Supply voltages V1 561, V2 562, V3 563, and V4 564 are selected to achieve the most efficient amplifier and keep the minimum power supply voltages as required by the output voltage swing. For example, the supply voltage V1 561 is set to +5 volts, the supply voltage V4 564 is set to 0 volts, and the supply voltage V2 562 and the supply voltage V3 563 are set to −5 volts.

Figure 6:
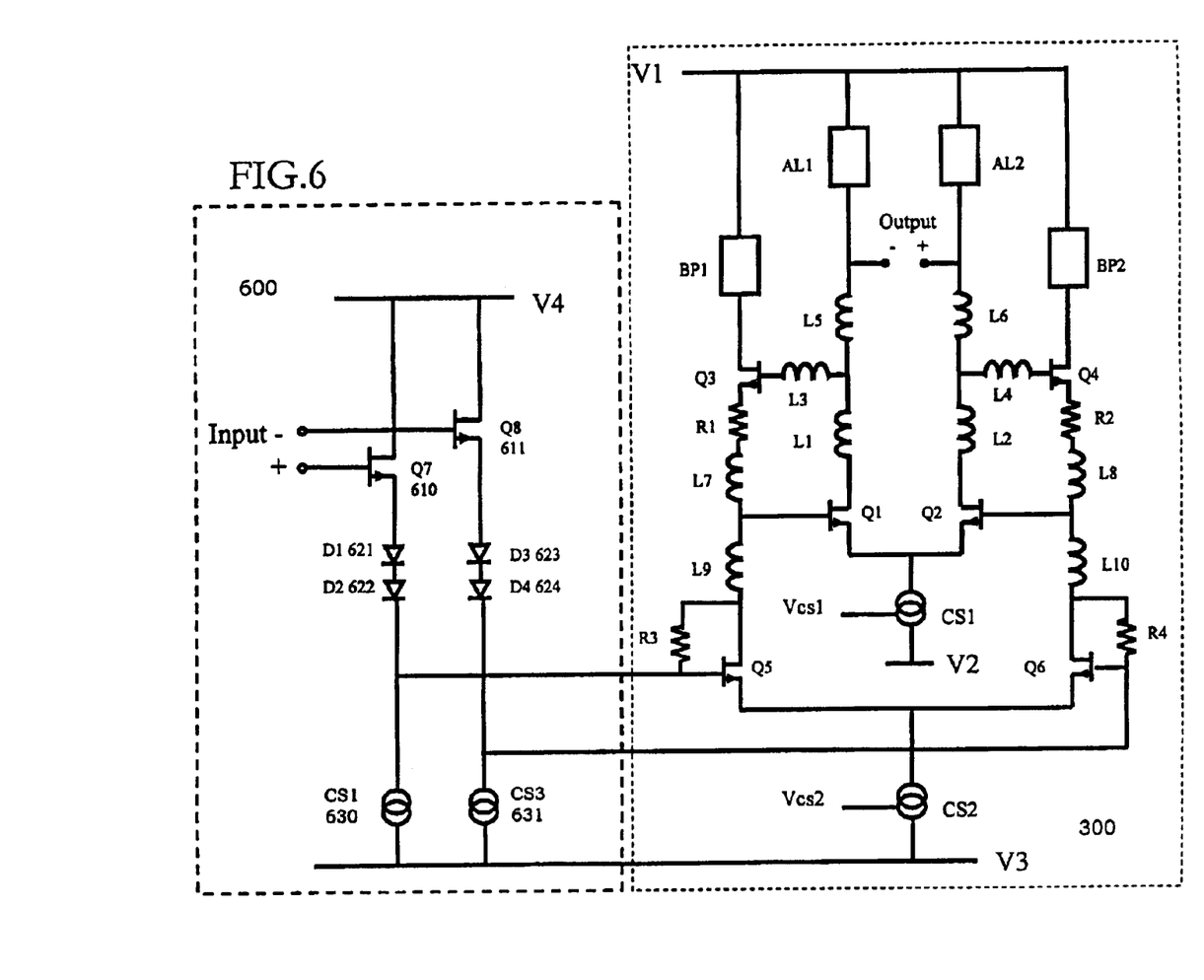
FIG. 6 is a circuit diagram illustrating a second embodiment of a predriver and the modulator driver in accordance with the present invention.

FIG. 6 is a circuit diagram illustrating a second embodiment of a predriver 600 and the modulator driver 300 that serve the same functions as the predriver 500 in FIG. 5 in producing low output impedance to attain maximum bandwidth. The predriver 600 acts as a buffer. A pair of source followers Q7 610 and Q8 611 provides a low output impedance drive from the predriver 600 to the modulator driver 300. Diodes D1 621, D2 622, D3 623, and D4 624 are level shifting devices to ensure voltages at the output of the predriver 600 match with a common mode voltage or DC required by the modulator driver 300 for operation. Current sources CS1 630 and CS3 631 provide bias currents for the predriver 600.

Figure 7:
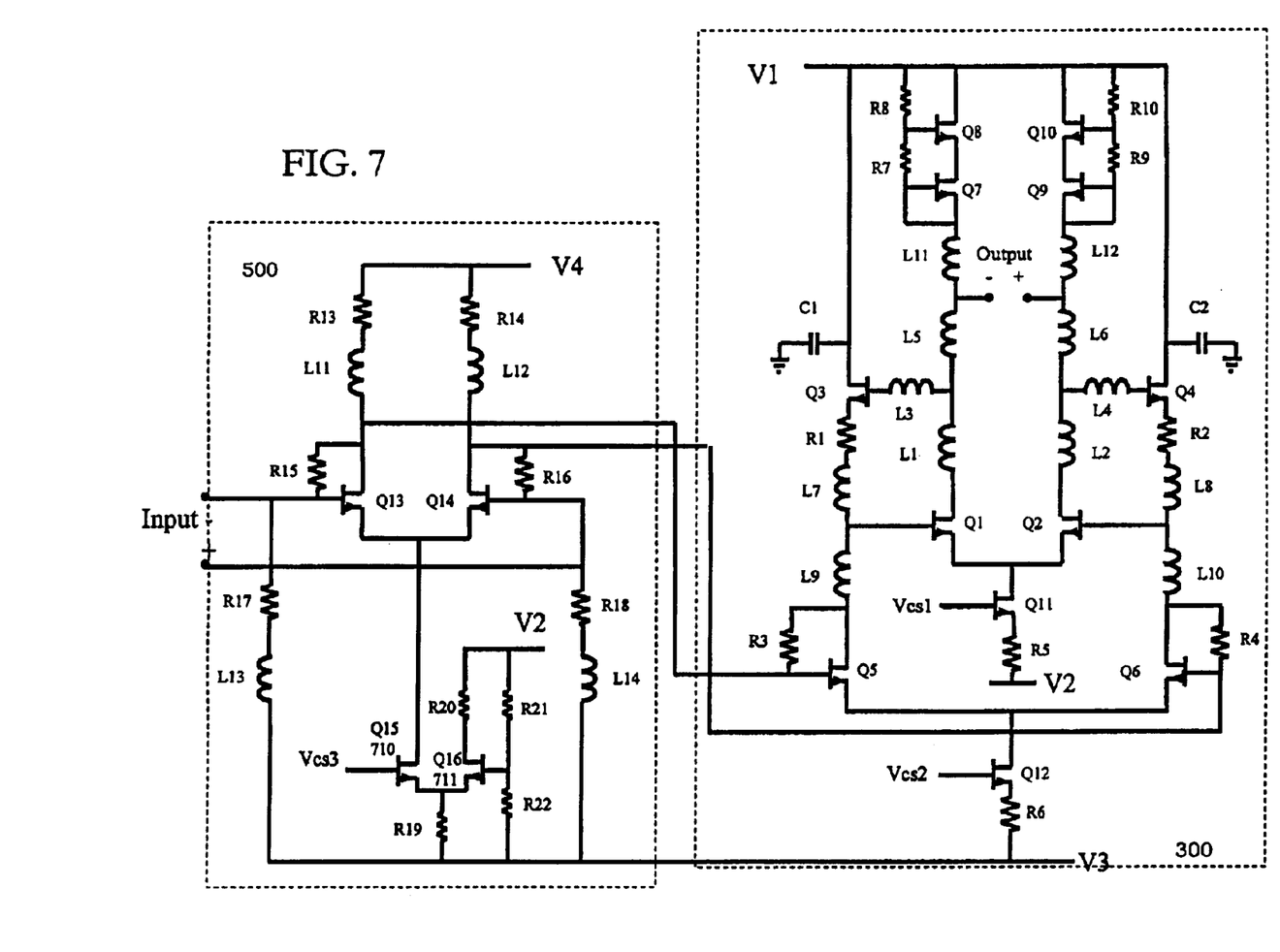
FIG. 7 is a detail circuit diagram illustrating the first embodiment of the predriver and the modulator driver as shown in FIG. 5 in accordance with the present invention.

FIG. 7 is a detailed circuit diagram illustrating the first embodiment of the predriver 500 and the modulator driver 300 as shown in FIG. 5. The current sources are explicitly made out of FETs and resistors. Significantly, transistors Q15 710 and Q16 711 serve as a variable current source for the predriver 500; this allows the gain of the predriver 500 to be changed, which in turn changes the output amplitude of the driver given a fixed input signal. Because this adjustment is made at the predriver stage, the output stage driver remains operating at the same bias point as before, and therefore its performance is not degraded during the adjustment of the output amplitude. Hence, variable output amplitudes can be achieved while retaining high pulse fidelity.

Figure 8:
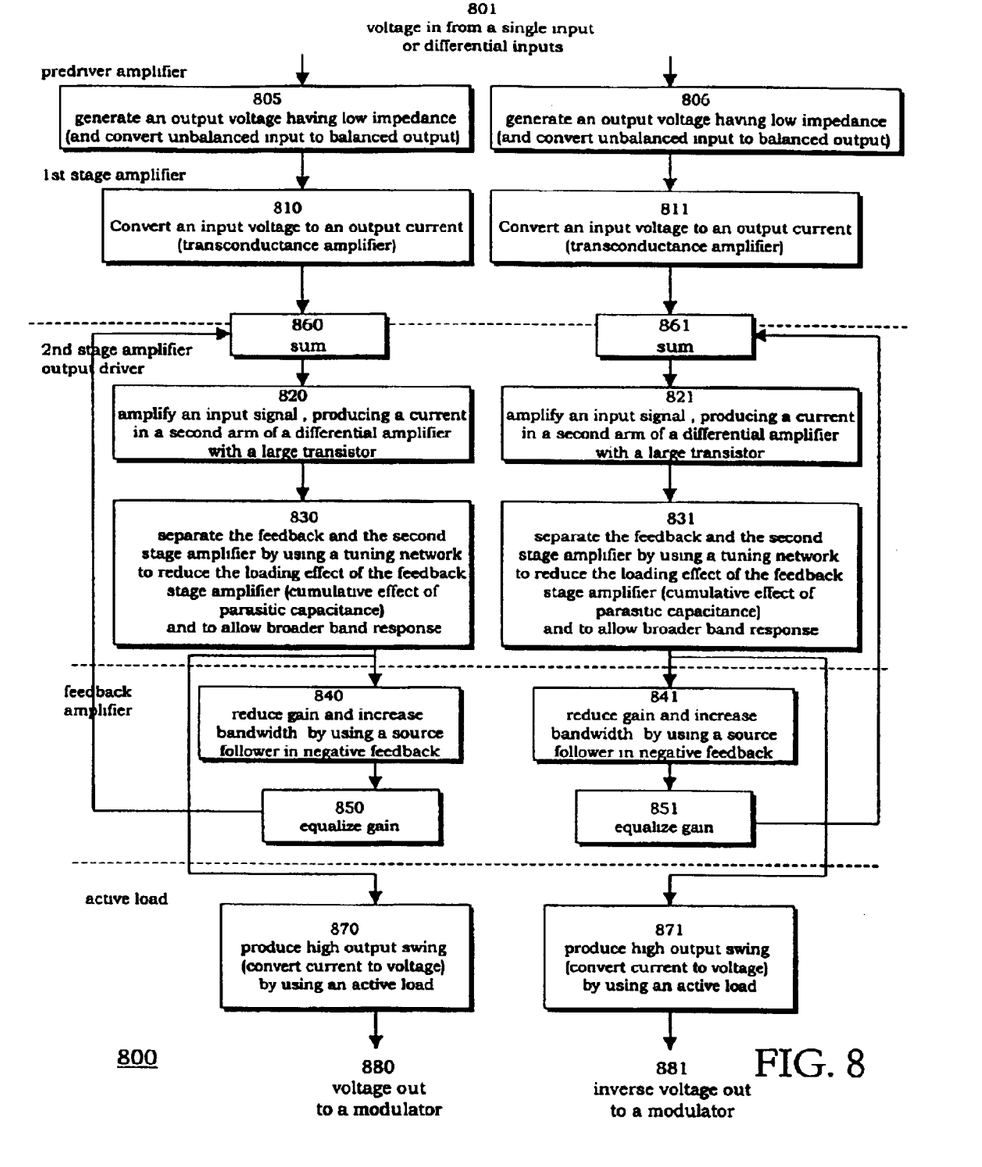
FIG. 8 is a flow diagram illustrating the operational process of a predriver and a modulator driver in accordance with the present invention.

FIG. 8 is a flow diagram illustrating the operational process 800 of the predriver 500 and the modulator 300. At predriver 500, an amplifier Q7 510 receives an input voltage 801 from either a single input or from differential inputs, and generates an output voltage with low impedance in step 805. The predriver amplifier Q7 510 and Q8 511 is also able to convert an unbalanced signal to a balanced signal. At the first driver stage A1 in step 810, the output voltage from the predriver 500 is converted to a current that is applied to the inputs of the second stage A2 by way of the summing node in step 860. At the second stage A2 in step 820, the large transistor Q1 310 amplifies this input signal to produce an output current in the first arm of the differential amplifier A2 240. The tuning network, which comprises inductors L1 241, L2 242, and L3 243 separates 830 the feedback stage A3 250*a* from the second stage amplifier A2 240, thereby reducing the loading effect of the feedback stage amplifier A3 250*a*. At step 840, the feedback stage amplifier A3 250*a*, which comprises the source follower Q3 320, in conjunction with resistor R1 251, reduces both the input impedance and gain and increases the bandwidth of the second stage amplifier A2 through negative feedback. The inductor L4 252 equalizes 850 the gain, which in turn increases the bandwidth and generates a desirable feedback response. At step 860, the summing node 230*a* sums the current output from the amplifier A1 220 with the feedback current from the feedback stage amplifier A3 250*a* through resistor R1 251. At step 870, the active load AL1 341 receives the output current from amplifier A2 240 and converts it to a final output voltage 880.

Similarly, in the second arm of a differential amplifier, at the predriver 500 an amplifier Q7 510 and Q8 511 receives an input voltage 801 from either a single input or from differential inputs, and generates an output voltage with low impedance in step 806. The predriver amplifier Q7 510 and Q8 511 is also able to convert an unbalanced signal to a balanced signal. The resulting signal voltages and currents in the second arm of the differential amplifiers are precisely 180 degrees out of phase with those in the first arm. At the first driver stage A1 in step 811, the output voltage from the predriver 500 is converted to a current that is applied to the inputs of the second stage A2 by way of the summing node in step 861. At the second stage A2 in step 821, the large transistor Q2 311 amplifies this input signal to produce an output current in the second arm of the differential amplifier A2 240. The tuning network, which comprises inductors L5 245, L6 246, and L7 247 separates 831 the feedback stage A3 250*b* from the second stage amplifier A2 240, thereby reducing the loading effect of the feedback stage amplifier A3 250*a*. At step 841, the feedback stage amplifier A3 250*b*, which comprises the source follower Q4 321, in conjunction with resistor R2 255, reduces both the input impedance and gain and increases the bandwidth of the second stage amplifier A2 through negative feedback. The inductor L8 256 equalizes 851 the gain, which in turn increases the bandwidth and generates a desirable feedback response. At step 861, the summing node 230*b* sums the current output from the amplifier A1 220 with the feedback current from the feedback stage amplifier A3 250*b* through resistor R2 255. At step 871, the active load AL2 342 receives the output current from amplifier A2 240 and converts the current to a final driver output voltage 881.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

I claim:

1. A modulator driver, comprising:
   a first amplifier stage (A1) having inputs and outputs, the first amplifier stage comprising a first differential pair of transistors;
   a second amplifier stage (A2) having inputs and outputs, the second amplifier stage comprising a second differential pair of transistors, the inputs of the second amplifier stage coupled to the outputs of the first amplifier stage;
   an active load coupled between a supply voltage and the outputs of the second amplifier stage and which produces an output voltage that varies with the electrical current conducted by said second differential pair of transistors, said active load arranged to provide an AC resistance that is greater than its equivalent DC resistance; and
   a feedback stage (A3) having inputs and outputs, the inputs of the feedback stage commonly coupled to the outputs of the second stage amplifier and the inputs of the active load, the outputs of the feedback stage commonly coupled to the inputs of the second stage amplifier and the outputs of the first amplifier stage.

2. The modulator driver of claim 1, wherein the feedback stage comprises a first feedback amplifier and a second feedback amplifier.

3. The modulator driver of claim 2, wherein the inputs of the first stage amplifier comprises positive and negative inputs, and wherein the outputs of the first stage amplifier comprises positive and negative outputs, the negative input having signal voltages and currents that are inverted relative to the positive input, the negative output having signal voltages and currents that are inverted relative to the positive output.

4. The modulator driver of claim 3, wherein the inputs of the second stage amplifier comprises positive and negative inputs, and wherein the outputs of the second stage amplifier comprise positive and negative outputs, the negative input having signal voltages and currents that are inverted relative to the positive input, the negative output having signal voltages and currents that are inverted relative to the positive output.

5. A modulator driver, comprising:
a first amplifier stage (A1) having inputs and outputs, the first amplifier stage comprising a first differential pair of transistors, wherein the inputs of the first amplifier stage comprise positive and negative inputs having signal voltages and currents that are inverted with respect to each other and the outputs of the first amplifier stage comprise positive and negative outputs having signal voltages and currents that are inverted with respect to each other;
a second amplifier stage (A2) having inputs and outputs, the second amplifier stage comprising a second differential pair of transistors, the inputs of the second amplifier stage coupled to the outputs of the first amplifier stage, wherein the inputs of the second amplifier stage comprise positive and negative inputs having signal voltages and currents that are inverted with respect to each other and the outputs of the second amplifier stage comprise positive and negative outputs having signal voltages and currents that are inverted with respect to each other;
an active load having inputs and outputs, the inputs of the active load coupled to the outputs of the second amplifier stage;
a feedback stage (A3) having inputs and outputs, the inputs of the feedback stage commonly coupled to the outputs of the second stage amplifier and the inputs of the active load, the outputs of the feedback stage commonly coupled to the inputs of the second stage amplifier and the outputs of the first amplifier stage, said feedback stage comprising a first feedback amplifier and a second feedback amplifier; and
a first tuning network, coupled between the negative output of the second stage amplifier and the input of the first feedback stage, and a second tuning network, coupled between the positive output of the second stage and the input of the second feedback stage.

6. The modulator driver of claim 5, further comprising a first summing node which couples the output of the first feedback stage to the positive input of the second amplifier stage and the negative output of the first amplifier stage, and a second summing node which couples the output of the second feedback stage and the negative input of the second amplifier stage and the positive output of the first amplifier stage.

7. The modulator driver of claim 6, further comprising a predriver amplifier, having differential outputs coupled to the differential inputs of the first amplifier stage.

8. The modulator driver of claim 5, wherein the first tuning network comprises a first inductor (L1) having a first end and a second end, a second inductor (L2) having a first end and a second end, and a third inductor (L3) having a first end and a second end, the first end of the first inductor coupled to the negative output of the second amplifier stage, the second end of the first inductor commonly coupled to the first end of the second inductor and the first end of the third inductor, the second end of the second inductor coupled to a negative input of the active load, the second end of the third inductor coupled to the input of the first feedback stage.

9. The modulator driver of claim 8, further comprising a first resistor (R1) and a fourth inductor (L4), coupled in series between the output of the first feedback stage and the first summing node.

10. The modulator driver of claim 9, wherein the second tuning network comprises a fifth inductor (L5) having a first end and a second end, a sixth inductor (L6) having a first end and a second end, and a seventh inductor (L7) having a first end and a second end, the first end of the fifth inductor coupled to the positive output of the second amplifier stage, the second end of the fifth inductor commonly coupled to the first end of the sixth inductor and the first end of the seventh inductor, the second end of the sixth inductor coupled to a positive input of the active load, the second end of the seventh inductor coupled to the input of the second feedback stage.

11. The modulator driver of claim 10, further comprising a second resistor (R2) and eighth inductor (L8), coupled in series between the output of the second feedback stage and the second summing node.

12. The modulator driver of claim 11, wherein each of the first, second, third, fourth, fifth, sixth, seventh, and eighth inductor comprises a transmission line.

13. The modulator driver of claim 7, wherein the predriver comprises a differential amplifier that exhibits an output impedance lower than its input impedance.

14. The modulator driver of claim 7, wherein the predriver comprises a pair of transistors configured as voltage followers.

15. The modulator driver of claim 5, wherein the first tuning network comprises a first single inductor having a first end and a second end, the first end of the first single inductor coupled to the negative output of the second amplifier stage, and the second end of the first single inductor coupled to the input of the first feedback network.

16. The modulator driver of claim 15, wherein the first single inductor comprises a transmission line.

17. The modulator driver of claim 16, wherein the second tuning network comprises a second single inductor having a first end and a second end, the first end of the second single inductor coupled to the positive output of the second amplifier stage, and the second end of the second single inductor coupled to the input of the second feedback network.

18. The modulator driver of claim 17, wherein the second single inductor comprises a transmission line.

19. A modulator driver, comprising:
a first amplifier stage (A1) having inputs and outputs, the first amplifier stage comprising a first differential pair of transistors, wherein the inputs of the first amplifier stage comprise positive and negative inputs having signal voltages and currents that are inverted with respect to each other and the outputs of the first amplifier stage comprise positive and negative outputs having signal voltages and currents that are inverted with respect to each other;
a second amplifier stage (A2) having inputs and outputs, the second amplifier stage comprising a second differential pair of transistors, the inputs of the second amplifier stage coupled to the outputs of the first amplifier stage, wherein the inputs of the second amplifier stage comprise positive and negative inputs having signal voltages and currents that are inverted with respect to each other and the outputs of the second amplifier stage comprise positive and negative outputs having signal voltages and currents that are inverted with respect to each other;

an active load having inputs and outputs, the inputs of the active load coupled to the outputs of the second amplifier stage; and a feedback stage (A3) having inputs and outputs, the inputs of the feedback stage commonly coupled to the outputs of the second stage amplifier and the inputs of the active load, the outputs of the feedback stage commonly coupled to the inputs of the second stage amplifier and the outputs of the first amplifier stage, said feedback stage comprising a first feedback amplifier and a second feedback amplifier;

wherein the first stage amplifier has a negative output coupled to a positive input by means of a third resistor (R3), and a positive output coupled to a negative input by means of a fourth resistor (R4).

20. The modulator driver of claim 7, wherein the gain of the predriver amplifier is electronically adjustable.

21. The modulator driver of claim 7, wherein the gain of the predriver amplifier is controlled by a variable current-source (CS3).

22. A method for operating a modulator driver, comprising:

in a first arm of a differential modulator driver:
amplifying a positive input voltage signal by a first amplifier to generate a first output current signal;
amplifying the first output current signal by a second amplifier to generate a first driver output signal;
providing a negative feedback of the first driver output signal to the positive input of the second amplifier by a first feedback amplifier;
wherein between the amplifying and the providing steps, tuning the first driver output signal by separating the second amplifier and the first feedback amplifier by means of an inductor network; and in a second arm of a differential modulator driver:
amplifying a negative input voltage signal by a first amplifier to generate a second output current signal;
amplifying the second output current signal by a second amplifier to generate a second driver output signal;
providing a negative feedback of the second driver output signal to the negative input of the second amplifier by a second feedback amplifier;
wherein between the amplifying and the providing steps, tuning the second driver output signal by separating the second amplifier and the second feedback amplifier by means of an inductor network.

23. The method of claim 22, wherein the input signal is applied only to one of the inputs of the first amplifier.

24. The method of claim 22, wherein the input signal is applied differentially to both inputs of the first amplifier.

25. The method of claim 22, further comprising producing a high output amplitude from the first driver output signal by a first active load (AL1).

26. The method of claim 25, further comprising producing a high output amplitude from the second driver output signal by a second active load (AL2).

27. The method of claim 22, further comprising:

equalizing the frequency response of a first negative feedback signal;

summing the first negative feedback signal with the first output current signal from a first amplifier; and providing a first summing signal to a first input of the second amplifier.

28. The method of claim 27, further comprising:

equalizing the frequency response of a second negative feedback signal;

summing the second negative feedback signal with the second output current signal from a first amplifier; and providing a second summing signal to a second input of the second amplifier.

29. The modulator driver of claim 1, wherein said active load comprises at least one depletion mode field-effect transistor (FET) having its gate and source connected together.

* * * * *